(12) United States Patent
Ngo

(10) Patent No.: US 6,919,739 B2
(45) Date of Patent: Jul. 19, 2005

(54) FEEDFORWARD LIMITED SWITCH DYNAMIC LOGIC CIRCUIT

(75) Inventor: Hung C. Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 10/733,950

(22) Filed: Dec. 11, 2003

(65) Prior Publication Data

US 2005/0127950 A1  Jun. 16, 2005

(51) Int. Cl.[7] .................................................. H03K 19/00
(52) U.S. Cl. ......................... 326/98; 326/95; 326/121; 327/208
(58) Field of Search ............................ 326/93, 95–98, 326/121, 112, 119; 327/208–212, 214, 215, 327/224, 225

(56) References Cited

U.S. PATENT DOCUMENTS

| | | | |
|---|---|---|---|
| 6,498,514 B2 * | 12/2002 | Alvandpour | 326/98 |
| 6,686,775 B2 * | 2/2004 | Campbell | 326/93 |
| 6,690,204 B1 * | 2/2004 | Belluomini et al. | 326/95 |
| 6,690,205 B2 * | 2/2004 | Alvandpour | 326/98 |
| 6,717,442 B2 * | 4/2004 | Campbell | 326/95 |
| 6,833,735 B2 * | 12/2004 | Kumar et al. | 326/95 |

* cited by examiner

*Primary Examiner*—Vibol Tan
(74) *Attorney, Agent, or Firm*—Richard F. Frankeny; Winstead Sechrest & Minick P.C.; Casimer K. Salys

(57) ABSTRACT

The N channel field effect transistor (NFET) of the inverting output stage of a LSDL gate is split into a large NFET and a small NFET. The large NFET is coupled to a feedforward pulse so that it is turned ON only when the inverting output is a logic one. When the inverting output is a logic one, another inverting stage turns ON if the dynamic node evaluates to a logic zero. The dynamic node is inverted and coupled to the large NFET on the inverting output stage thus quickly pulling the inverting output to a logic zero. The small NFET is turned ON as a keeper device through the normal logic path. If the inverting data output is a logic zero the feedforward pulse is not generated. By making the largest NFET a pulsed device the other FETs are reduced in size resulting in leakage and switching power savings.

16 Claims, 8 Drawing Sheets

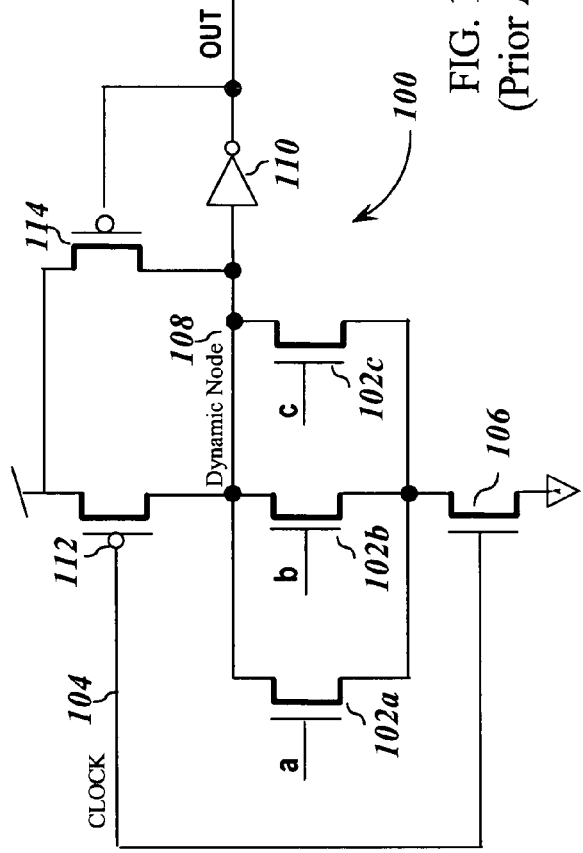
FIG. 1.1 (Prior Art)
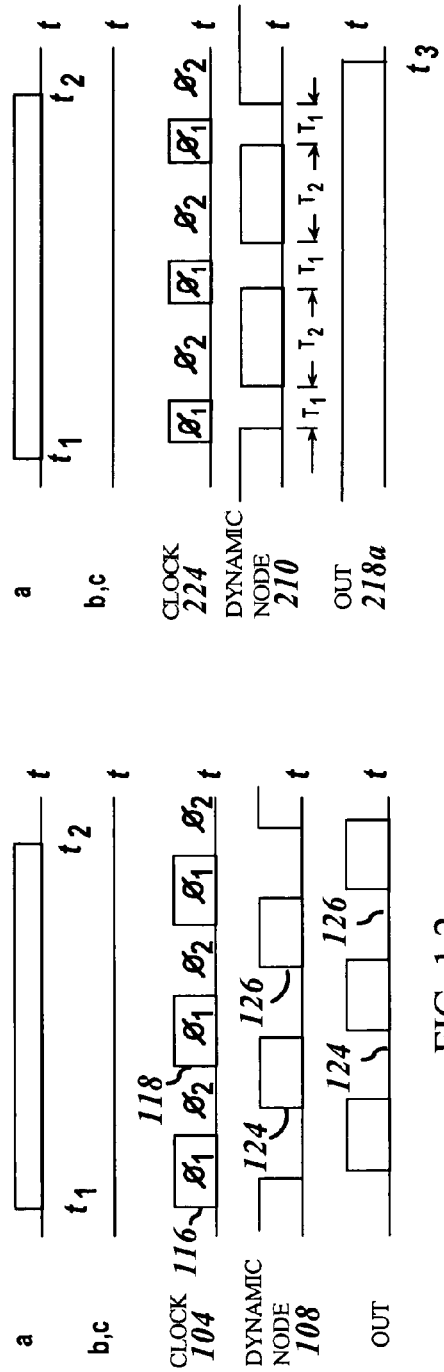
FIG. 2.3
FIG. 1.2 (Prior Art)

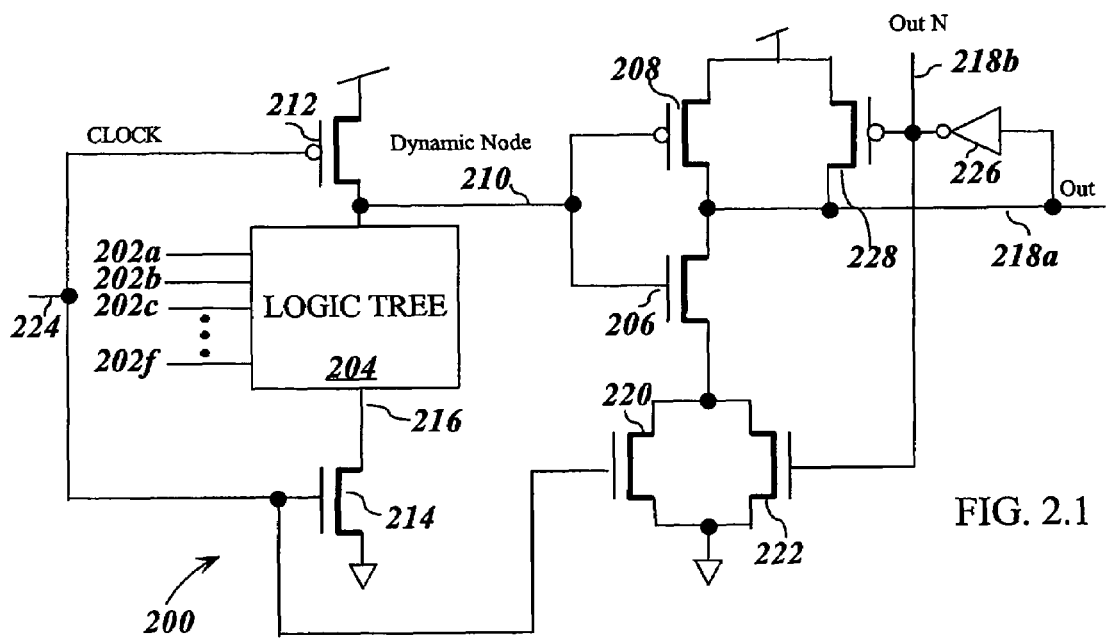
FIG. 2.1
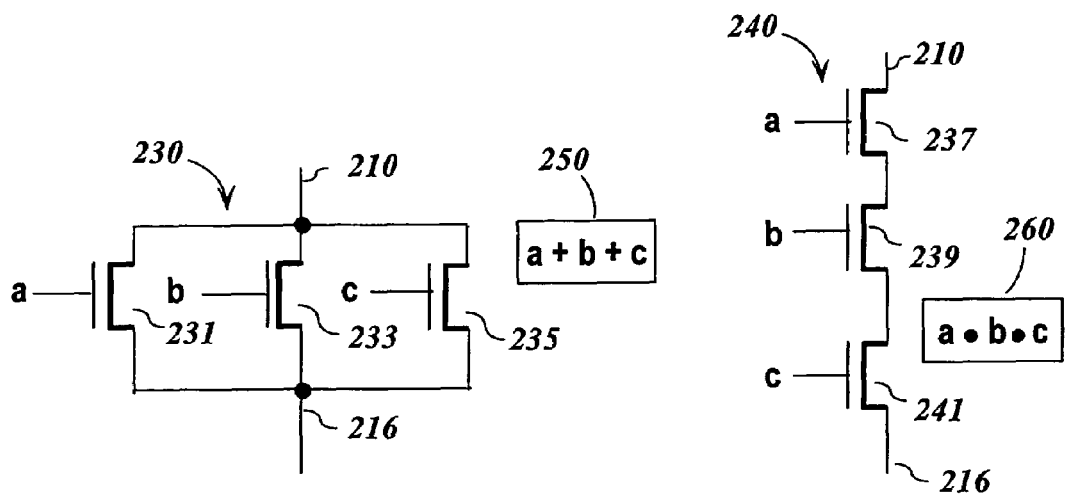
FIG. 2.2.1
FIG. 2.2.2

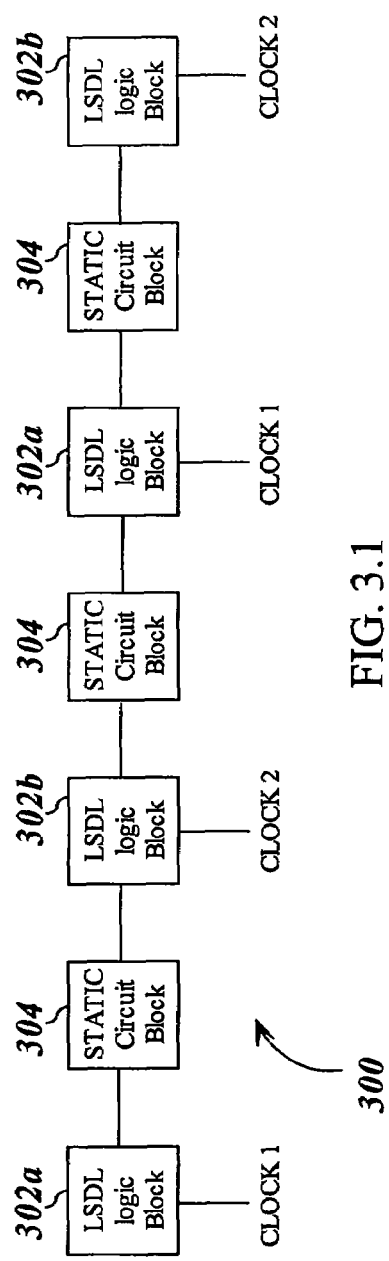
FIG. 3.1
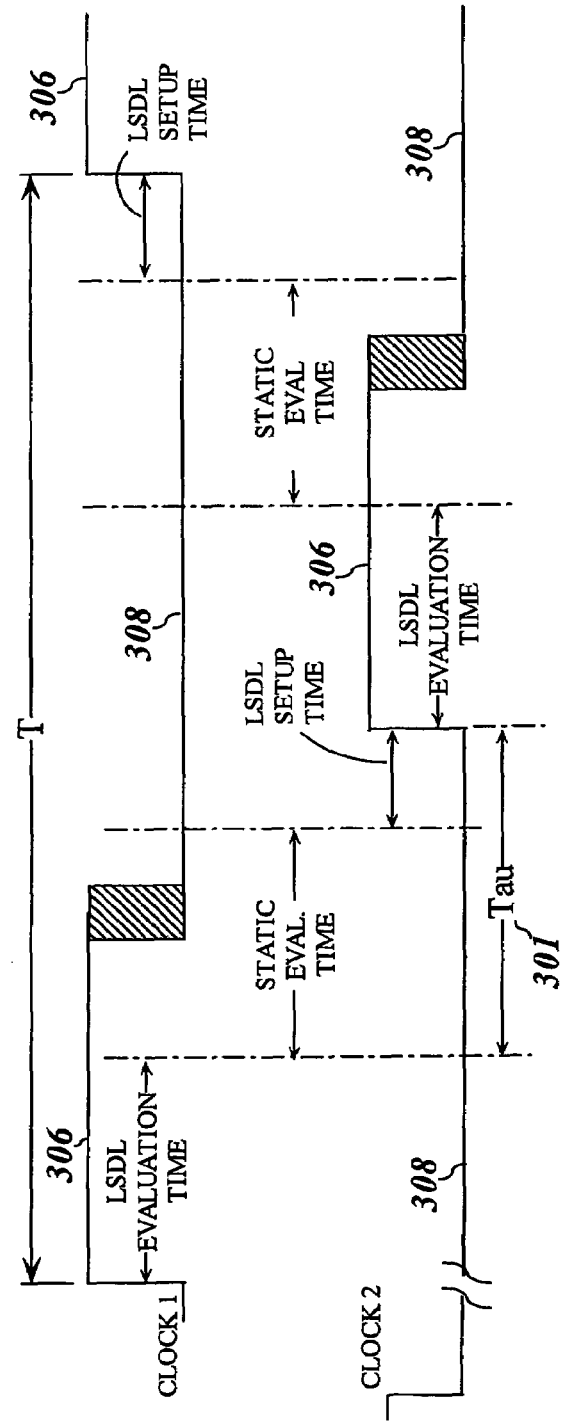
FIG. 3.2

FEEDFORWARD LIMITED SWITCH DYNAMIC LOGIC CIRCUIT

CROSS REFERENCE TO RELATED APPLICATION

The present invention is related to U.S. patent application Ser. No. 10/116,612, filed Apr. 4, 2002, entitled "CIRCUITS AND SYSTEMS FOR LIMITED SWITCH DYNAMIC LOGIC," which is incorporated by reference herein.

TECHNICAL FIELD

The present invention relates in general to metal oxide silicon (MOS) dynamic logic circuits.

BACKGROUND INFORMATION

Modem data processing systems may perform Boolean operations on a set of signals using dynamic logic circuits. Dynamic logic circuits are clocked. During the precharge phase of the clock, the circuit is preconditioned, typically by precharging an internal node (dynamic node) of the circuit by coupling to a power supply rail. During an evaluate phase of the clock, the Boolean function being implemented by the logic circuit is evaluated in response to the set of input signal values appearing on the inputs during the evaluate phase. (For the purposes herein, it suffices to assume that the input signals have settled to their "steady-state" values for the current clock cycle, recognizing that the input value may change from clock cycle to clock cycle.) Such dynamic logic may have advantages in both speed and the area consumed on the chip over static logic. However, the switching of the output node with the toggling of the phase of the clock on each cycle may consume power even when the logical value of the output is otherwise unchanged.

This may be appreciated by referring to FIG. 1.1 illustrating an exemplary three-input OR dynamic logic gate, and the accompanying timing diagram, FIG. 1.2. Dynamic logic 100 includes three inputs a, b and c coupled to a corresponding gate of NFETs 102a–102c. During an evaluate phase $N_1$ (116) of clock 104, NFET 106 is active, and if any of inputs a, b or c are active, dynamic node 108 is pulled low, and the output OUT goes "high" via inverter 110. Thus, referring to FIG. 1.2, which is illustrative, at $t_1$, input a goes high during a precharge phase $N_2$ of clock 104. During the precharge phase $N_2$ of clock 104, dynamic node 108 is precharged via PFET 112. Half-latch PFET 114 maintains the charge on dynamic node 108 through the evaluate phase, unless one or more of inputs a, b or c is asserted. In the illustrative timing diagrams in FIG. 1.2, input a is "high" having a time interval $t_1$ through $t_2$ that spans approximately 2½ cycles of clock 104, which includes evaluation phases, 116 and 118. Consequently, dynamic node 108 undergoes two discharge-precharge cycles, 124 and 126. The output node similarly undergoes two discharge-precharge cycles, albeit with opposite phase, 124 and 126. Because the output is discharged during the precharge phase of dynamic node 108, even though the Boolean value of the logical function is "true" (that is, "high" in the embodiment of OR gate 100) the dynamic logic dissipates power even when the input signal states are unchanged.

Additionally, dynamic logic may be implemented in a dual rail embodiment in which all of the logic is duplicated, one gate for each sense of the data. That is, each logic element includes a gate to produce the output signal, and an additional gate to produce its complement. Such implementations may exacerbate the power dissipation in dynamic logic elements, as well as obviate the area advantages of dynamic logic embodiments.

Limited switching dynamic logic (LSDL) circuits produce circuits which mitigate the dynamic switching factor of dynamic logic gates with the addition of static logic devices which serve to isolate the dynamic node from the output node. Co-pending U.S. patent application entitled, "CIRCUITS AND SYSTEMS FOR LIMITED SWITCH DYNAMIC LOGIC," Ser. No. 10/116,612 filed Apr. 4, 2002 and commonly owned, recites such circuits. Additionally, LSDL circuits and systems maintain the area advantage of dynamic logic over static circuits, and further provide both logic senses, that is, the output value and its complement.

A logic buffer is a logic circuit that isolates or "buffers" a logic signal. It may be used to increase the fan-out of a logic signal. In some cases, a buffer also inverts the logic signal, thus a logic inverter may be thought of as an inverting buffer. As with standard logic functions, there may be static and clocked buffers. The LSDL logic technology uses both static devices and LSDL logic devices. In standard LSDL, a buffer is realized by replacing the logic tree with a single device. In this way, a logic signal coupled to the data input is clocked into the LSDL buffer and a latched output and its inversion are generated. Because there are a large number of buffers used in any modern integrated circuit (IC) design, buffers are key and perhaps the primary power contributors in any logic design. This is equally true for LSDL designs.

There is, therefore, a need for an LSDL buffer design that maintains all of the LSDL circuit advantages over other dynamic logic while reducing the dynamic power dissipated.

SUMMARY OF THE INVENTION

The pull down device in inverting data output stage of an LSDL gate is split into a large NFET and a small NFET. The large NFET is gated by a feedforward pulse that is generated only when the logic state of the inverting data output is a logic zero and the dynamic node evaluates to a logic zero. The dynamic node is coupled to a gated inverter that inverts the state of the dynamic node. If the inverting data output is a logic one, then an inverter inverts this state and enables the gated inverter. The output of the gated inverter generates a logic one feedforward pulse when the inverting data output is a logic one and the dynamic node evaluates to a logic zero. The logic one feedforward pulse turns ON the large NFET which quickly pulls the inverting data output to a logic zero. The small NFET acts as a keeper and is turned ON through the normal LSDL logic path. When the inverting data output is a logic zero, then the large NFET remains OFF reducing switching power and leakage power. Since the largest NFET in the feedforward LSDL logic gate is pulse driven, the remaining FET devices may be scaled down in size further reducing power as they in turn drive smaller devices. Even though additional circuitry is added for the gated inverter and the inverting stage there is a net reduction in device area and thus power savings.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 1.1 illustrates, in partial schematic form, a dynamic logic gate which may be used in conjunction with the present invention;

FIG. 1.2 illustrates a timing diagram corresponding to the logic gate embodiment illustrated in FIG. 1.1;

FIG. 2.1 illustrates, in partial schematic form, a standard LSDL device illustrating the static logic devices for isolating the dynamic node from the output node;

FIG. 2.2.1 illustrates, in partial schematic form, circuitry for incorporation in the logic tree of FIG. 2.1 whereby the logic function performed is the logical OR of three input signals;

FIG. 2.2.2 illustrates, in partial schematic form, another circuit for incorporation in the logic tree of FIG. 2.1 whereby the logic function performed is the logical AND of three input signals;

FIG. 2.3 illustrates a timing diagram corresponding to an embodiment of the dynamic logic device of FIG. 2.1 in which the logic function performed is the logical OR of three input signals;

FIG. 3.1 illustrates, in block diagram form, a limited switch dynamic logic system in accordance with an embodiment of the present invention;

FIG. 3.2 illustrates a two-phase clock which may be used in conjunction with the logic system of FIG. 3.1;

DETAILED DESCRIPTION

Figure 4:
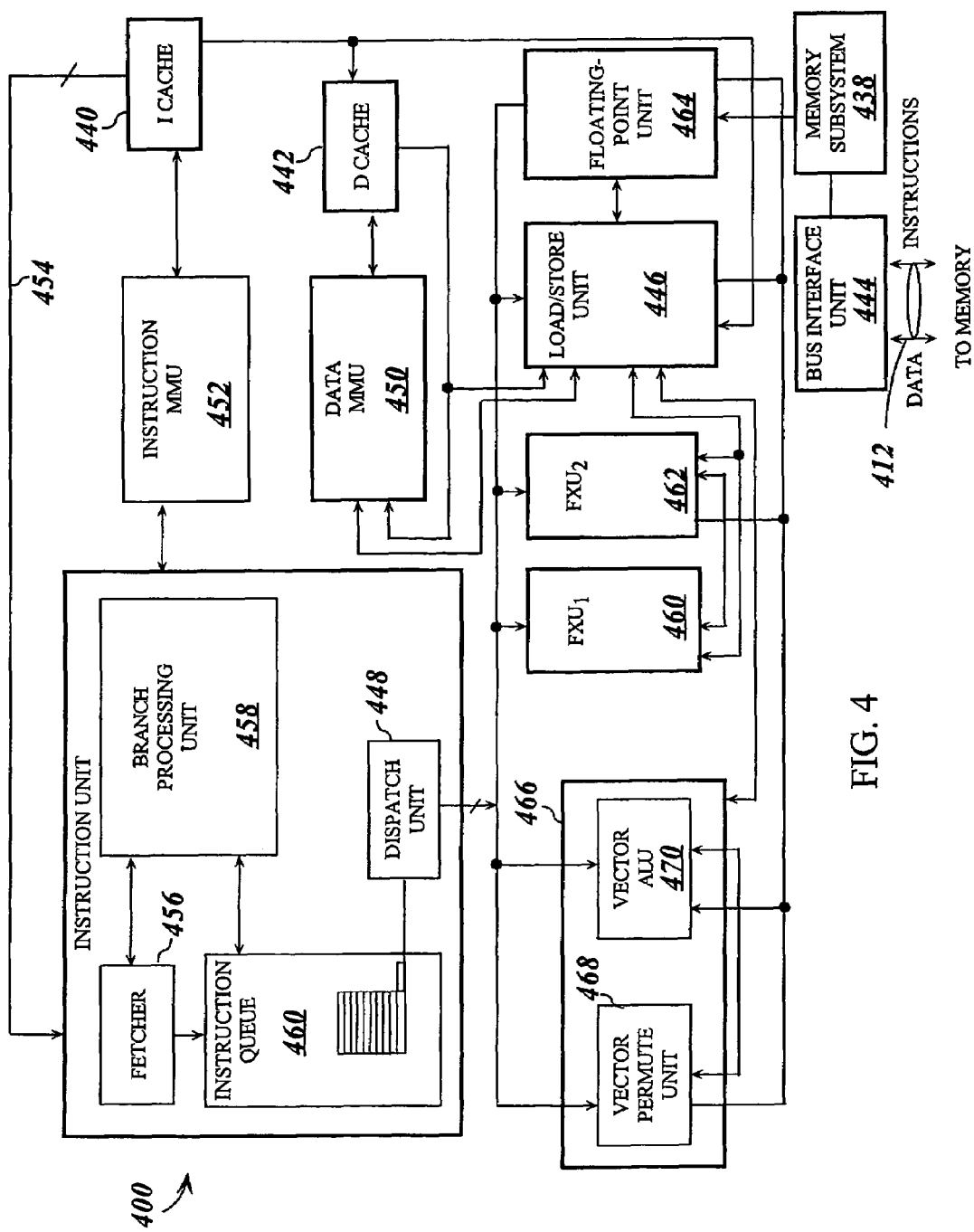
FIG. 4 illustrates a high level block diagram of selected operational blocks within a central processing unit (CPU) incorporating the present inventive principles.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, data formats within communication protocols, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 2.1 illustrates a standard limited switch dynamic logic (LSDL) device 200. In general, LSDL device 200 receives a plurality, n, of inputs 202a . . . 202f provided to logic tree 204, and outputs a Boolean combination of the inputs. The particular Boolean function performed by LSDL device 200 is reflected in the implementation of logic tree 204 (accounting for the inversion performed by the inverter formed by n-channel field effect transistor (NFET) 206 and p-channel field effect transistor (PFET) 208). Logic tree 204 is coupled between the drain of PFET 212 and the drain of NFET 214, node 216. The junction of the logic tree 204 and the drain of PFET 212 forms dynamic node 210.

For example, FIG. 2.2.1 illustrates logic tree 230 including three parallel connected NFETs, 231, 233 and 235. Logic tree 230 may be used to provide a logic device generating the logical NOR of the three input signals coupled to corresponding ones of the gates of NFETs 231, 233 and 235, a, b and c (as indicated by the Boolean expression 250 in FIG. 2.2.1) and accounting for the inversion via NFET 206 and PFET 208. Similarly, FIG. 2.2.2 illustrates a logic tree 240 including three serially connected NFETs 237, 239 and 241. Logic tree 240 may be used in conjunction with the logic device 200 to generate the logical NAND of the three input signals a, b and c (as indicated by the Boolean expression 260 in FIG. 2.2.2).

Returning to FIG. 2.2.1, dynamic node 210 is coupled to the common junction of the gates of NFET 206 and PFET 208 which invert the signal on dynamic node 210. The inversion of the signal on dynamic node 210 is provided on Out 218a. The transistor pair, 206 and 208, is serially coupled to parallel NFETs 220 and 222. NFET 220 is switched by clock signal 224. Thus, during the evaluate phase of clock signal 224, the inverter pair, NFET 206 and PFET 208, are coupled between the supply rails by the action of NFET 220.

The operation of LSDL device 200 during the evaluate phase, $N_1$, may be further understood by referring to FIG. 2.3 illustrating an exemplary timing diagram corresponding to the dynamic logic circuit of FIG. 2.1 in combination with a logic tree embodiment 230 of FIG. 2.2.1. In this way, for purposes of illustration, the timing diagram in FIG. 2.3 is the counterpart to the timing diagram in FIG. 1.2 for the three-input OR gate 100 depicted in FIG. 1.1. As shown, input a is "high" or "true" between $t_1$ and $t_2$. In the evaluate phase, $N_1$ of clock signal 224, dynamic node 210 is pulled down (intervals $T_1$). In these intervals, Out 218a is held high by the action of the inverter formed by transistors 206 and 208, which inverter is active through the action of NFET 220 as previously described. In the intervening intervals, $T_2$, dynamic node 210 is pulled up via the action of the precharge phase, $N_2$ of clock signal 224, and PFET 212. In these intervals, the inverter is inactive as NFET 220 is off. Out 218a is held "high" by the action of inverter 226 and PFET 228. Note also that the output of inverter 226 may provide a complementary output, Out N 218b. (Thus, with respect to the three-input logic trees in FIGS. 2.2.1 and 2.2.2, the corresponding logic device represents a three-input OR gate and a three-input AND gate, respectively.)

Returning to FIG. 2.1, if the logic tree evaluates "high", that is the Boolean combination of inputs 202a . . . 202d represented by logic tree 204, evaluate high, whereby dynamic node 210 maintains its precharge, Out 218a is discharged via NFET 206 and NFET 220. In the subsequent precharge phase, $N_2$, of clock signal 224, Out 218a is latched via the action of inverter 226 and NFET 222. Thus, referring again to FIG. 2.3, corresponding to the three input OR embodiment of logic device 200 and logic tree 230 (FIG. 2.2.1) at $t_2$ input a falls, and in the succeeding evaluate phase of clock signal 224, dynamic node 210 is held high by the precharge. The inverter pair, NFETs 206 and 208, are active in the evaluate phase of $N_1$, of clock signal 224 because of the action of NFET 220. Consequently, Out 218a falls ($t_3$).

In the succeeding precharge phase, N$_2$ of clock signal 224, Out 218a is latched in the "low" state, as previously described.

In this way, LSDL device 200 in FIG. 2.1, may provide a static switching factor on Out 218a, and likewise with respect to the complementary output Out N 218b. It would also be recognized by artisans of ordinary skill that although LSDL device 200, FIG. 2.1, has been described in conjunction with the particular logic tree embodiments of FIG. 2.2.1 and FIG. 2.2.2, the principles of the present invention apply to alternative embodiments having other logic tree implementations, and such alternative embodiments fall within the spirit and the scope of the present invention.

Note too, as illustrated in the exemplary timing diagram in FIG. 2.3, the duty factor of the clock signal may have a value that is less than fifty percent (50%). In such an embodiment, the evaluate phase, N$_1$, of the clock signal may be shorter in duration than the precharge phase, N$_2$. A clock signal having a duty factor less than fifty percent (50%) may be referred to as a pulse (or pulsed) clock signal. Note that a width of the evaluate phase may be sufficiently short that leakage from the dynamic node may be inconsequential. That is, leakage does not affect the evaluation of the node.

In such a clock signal embodiment, the size of the precharge device (PFET 212 in the embodiment of FIG. 2.1) may be reduced. It would be recognized by those of ordinary skill in the art that a symmetric clock signal has a fifty percent (50%) duty cycle; in an embodiment in which the duty cycle of the clock signal is less than fifty percent (50%), the size of the precharge device may be reduced concomitantly. In particular, an embodiment of the present invention may be implemented with a clock signal duty cycle of approximately thirty percent (30%). Additionally, while logic device 200 has been described from the perspective of "positive" logic, alternative embodiments in accordance with the present inventive principles may be implemented in the context of "negative" logic and such embodiments would also fall within the spirit and scope of the present invention.

FIG. 3.1 illustrates a portion 300 of a data processing system incorporating LSDL circuits in accordance with the present inventive principles. System portion 300 may be implemented using a two-phase clock signal (denoted clock 1 and clock 2). A timing diagram which may be associated with system portion 300 will be discussed in conjunction with FIG. 3.2. LSDL blocks 302b that may be clocked by a second clock signal phase, clock 2, alternates with LSDL block 302a clocked by the first clock signal phase, clock 1. Additionally, system portion 300 may include static logic elements 304 between LSDL blocks. Typically, static circuit blocks 304 may include gain stages, inverters or static logic gates. Static circuit blocks 304 are differentiated from LSDL blocks 302a and 302b as they do not have dynamic nodes that have a precharge cycle. However, alternative embodiments may include any amount of static logic. Additionally, as previously mentioned, an embodiment of system portion 300 may be implemented without static circuit blocks 304.

FIG. 3.2 illustrates a timing diagram which may correspond to a logic system employing a two-phase, pulsed clock signal, such as system portion 300, FIG. 3.1, in accordance with the present inventive principles. The LSDL circuits evaluate during the LSDL evaluate, or drive, portion 306 of their respective clock signals. As previously described, the duty factor of each of clock 1 and clock 2 may be less than fifty percent (50%). The width of the LSDL drive portions 306 of the clock signals need only be sufficiently wide to allow the evaluate node (such as dynamic node 210, FIG. 2.1) to be discharged through the logic tree (e.g., logic tree 204, FIG. 2.1). As previously described, the duration of the drive portion may be sufficiently narrow that leakage from the evaluation may be inconsequential. Consequently, LSDL circuits are not particularly sensitive to the falling edge of the clock signals, and in FIG. 3.2, the falling portion of the evaluate phase 306 of the clock signals has been depicted with cross-hatching. As noted herein above, the duty factor of clock 1 and clock 2 may be approximately thirty percent (30%) in an exemplary embodiment of the present invention. (It would be appreciated, however, that the present inventive principles may be incorporated in alternative embodiments which have other duty factors.) During the precharge portion 308 of the clock signals, the dynamic node (for example, dynamic node 210, FIG. 2.1) is precharged, as previously discussed. Clock 2 is 180° ($\pi$ radians) out of phase with clock 1 (shifted in time one-half of period T). Thus as shown, the evaluate portion 306 of clock 2 occurs during the precharge phase 308 of clock 1. Because in LSDL circuits, the output states may not change during the evaluate phase of the driving clock signal; the inputs to LSDL blocks, for example, LSDL blocks 302b, FIG. 3.1, are stable during the evaluate phase of the corresponding driving clock signal, clock 2. The time interval, between the end of the evaluate portion 306 of clock 1 and the rising edge of clock 2 may be established by the setup time of the LSDL, and the evaluation time of the static blocks, if any (for example, static blocks 304, FIG. 3.1). The time, Tau 301, together with duty factor may determine the minimum clock signal period for a particular LSDL circuit implementation. Thus, a system portion 300, FIG. 3.1 having a two-phase clock signal effects two dynamic evaluations per period, T$_1$ of the driving clock signals. It would be further appreciated by those of ordinary skill in the art that, in general, the present inventive principles may be incorporated in alternative embodiments of an LSDL system having a plurality, n, of clock signal phases. Such alternative embodiments would fall within the spirit and scope of the present invention.

An LSDL system in accordance with the principles of the present invention, such as system 300, FIG. 3.1, may be used, in an exemplary embodiment, in an arithmetic logic unit (ALU). A typical ALU architecture requires a significant number of exclusive-OR (XOR) operations. The XOR of two Boolean values requires having both senses of each of the Boolean values, that is, both the value and its complement (a$\oplus$b=ab'+a'b). As previously described, use of dual rail dynamic logic to implement such functionality obviates the advantages in area and power otherwise obtained by dynamic logic. A data processing system including an ALU embodying the present inventive principles is illustrated in FIG. 4.

FIG. 4 is a high level functional block diagram of selected operational blocks that may be included in a central processing unit (CPU) 400. In the illustrated embodiment, CPU 400 includes internal instruction cache (I-cache) 440 and data cache (D-cache) 442 which are accessible to memory (not shown in FIG. 4) through bus 412, bus interface unit 444, memory subsystem 438, load/store unit 446 and corresponding memory management units: data MMU 450 and instruction MMU 452. In the depicted architecture, CPU 400 operates on data in response to instructions retrieved from I-cache 440 through instruction dispatch unit 448. Dispatch unit 448 may be included in instruction unit 454 which may also incorporate fetch unit 456 and branch processing unit 458 which controls instruction branching. An instruction queue 460 may interface fetch unit 456 and dispatch unit 448. In response to dispatched instructions, data retrieved from D-cache 442 by load/store unit 446 can be operated upon by one of fixed point unit (FXU) 460, FXU 462 or floating point execution unit (FPU) 464. Additionally, CPU 400 provides for parallel processing of multiple data items via vector execution unit (VXU) 466. VXU 466 includes vector permute unit 468 which performs permutation operations on vector operands, and vector arithmetic logic unit (VALU) 470 which performs vector arithmetic operations, which may include both fixed-point and floating-point operations on vector operands. VALU 470 may be implemented using feedforward LSDL gates in accordance with the present inventive principles, and in particular may incorporate LSDL logic systems, of which LSDL system 300, FIG. 3.1 is exemplary.

Figure 5:
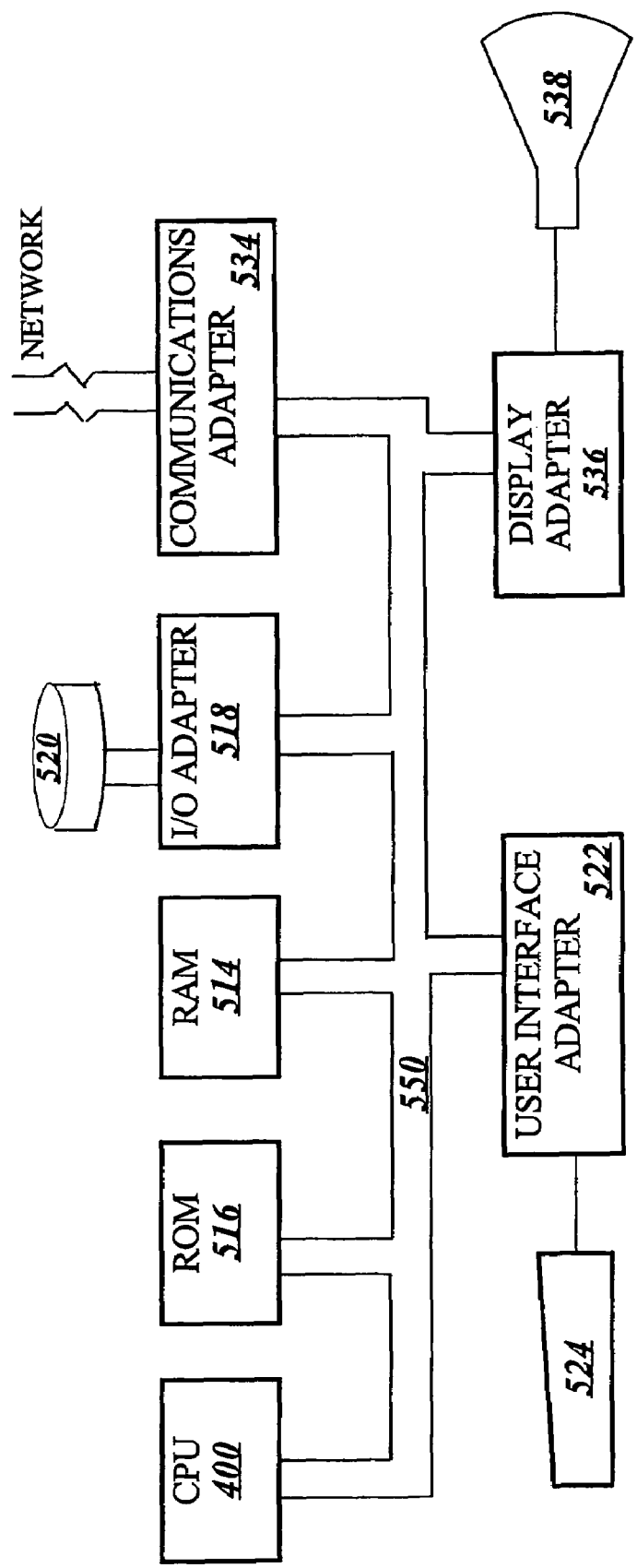
FIG. 5 illustrates a data processing system configured in accordance with the present invention.

A representative hardware environment 500 for practicing the present invention is depicted in FIG. 5, which illustrates a typical hardware configuration of a data processing system in accordance with the subject invention having CPU 400, incorporating the present inventive principles, and a number of other units interconnected via system bus 550. The data processing system shown in FIG. 5 includes random access memory (RAM) 514, read only memory (ROM) 516, and input/output (I/O) adapter 518 for connecting peripheral devices such as disk units 520 to bus 550, user interface adapter 522 for connecting keyboard 524, mouse 526, and/or other user interface devices such as a touch screen device (not shown) to bus 550, communication adapter 534 for connecting the system to a data processing network, and display adapter 536 for connecting bus 550 to display device 538. Note that CPU 400 may reside on a single integrated circuit.

Figure 6:
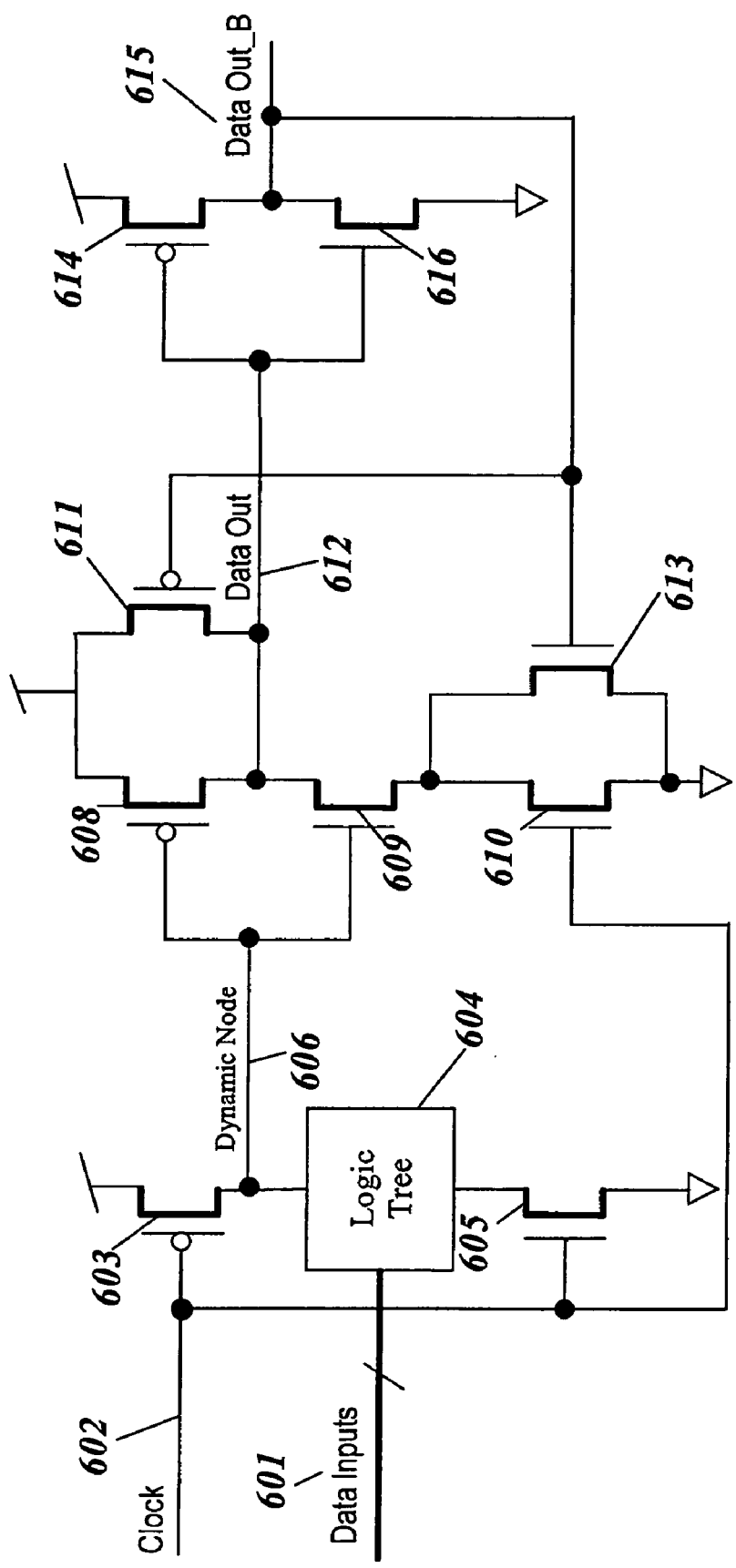
FIG. 6 is a circuit diagram of a standard LDSL logic gate.

FIG. 6 is the circuit for a standard LSDL logic gate with clock 602 and Data Inputs 601. PFET 603 is the pull-up used to pre-charge dynamic node 606 when the clock is logic zero. Logic tree 604 logically combines the Data Inputs 601 generating a logic state and NFET 605 asserts this logic state on dynamic node 606 when clock 602 is a logic one. The logic state of the dynamic node is inverted by PFET 608 and NFET 609. If the dynamic node asserts to a logic zero, PFET 608 turns ON and Data Out 612 transitions to a logic one and Data Out_B transitions to a logic zero. When Data Inputs 601 is a logic one, the logic one state at Data Out 612 is latched by action of PFET 611 and the logic zero state of Data Out_B 615. When Data In 601 is a logic zero, dynamic node 606 asserts to a logic one and this logic state is inverted to a logic zero at Data Out 612 by the action of NFET 609 and NFET 610 when clock 602 transitions to a logic one. Data Out_B transitions to a logic one and the logic zero of Data Out 612 is latched by the action of NFET 613 and the logic one state of Data Out_B.

Figure 7:
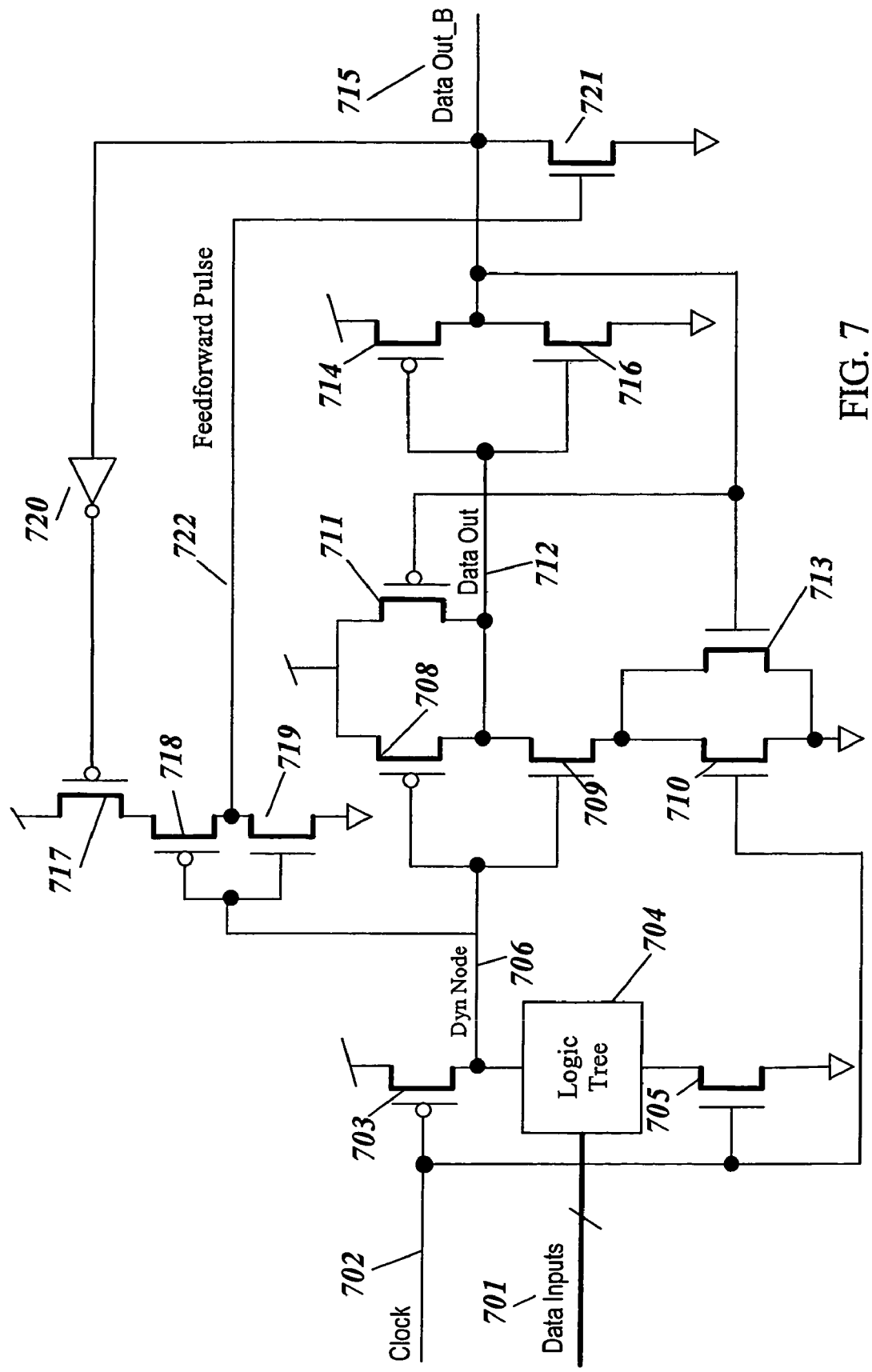
FIG. 7 is a circuit diagram of an LSDL logic gate according to embodiments of the present invention.

FIG. 7 is the circuit of the improved LSDL logic gate (LSDL) 700 with reduced power according to embodiments of the present invention. In this embodiment, Data Inputs 701 are coupled to logic tree 704 which performs a logic combination of Data Inputs 701 and generates a logic state. Clock 702 is coupled to PFET 703 and to the gates of NFET 705 and NFET 710. Dynamic node 706 is pre-charged to a logic one when Clock 702 is a logic zero.

The logic state of the dynamic node is inverted by PFET 708 and NFET 709. If the dynamic node 706 asserts to a logic zero, PFET 708 turns ON and Data Out 712 transitions to a logic one and Data Out_B 715 transitions to a logic zero. When Data Inputs 701 is a logic one, the logic one state at Data Out 712 is latched by action of PFET 711 and the logic zero state of Data Out_B 715. When Data In 701 is a logic zero, dynamic node 706 asserts to a logic one and this logic state is inverted to a logic zero at Data Out 712 by the action of NFET 709 and NFET 710 when clock 702 transitions to a logic one. Data Out_B 715 transitions to a logic one and the logic zero of Data Out 712 is latched by the action of NFET 713 and the logic one state of Data Out_B 715.

This embodiment of the present invention adds NFET 721, inverter 720, PFETs 717 and 718 and NFET 719. LSDL 700 splits out a portion of the function of NFET 716 into NFET 721. NFET 716 functions to pull down Data Out_B 715 to a logic zero whenever dynamic node 706 evaluates to a logic zero. LSDL 700 implements NFET 716 as a small device which acts as a keeper and NFET 721 as a large device which quickly pulls Data Out_B 715 when the dynamic node 706 transitions to a logic zero. When dynamic node evaluates to a logic zero, the inverting stage comprising PFETs 717 and 718 and NFET 719 generate a logic one Feedforward pulse (FFP) 722 if Data Out_B is a logic one. Therefore large NFET 721 only turns ON when Data Out_B 715 is transitioning to a logic zero. If Data Out_B 715 is already a logic zero, it is held at this logic zero state by small NFET 716. Since NFET 721 is mostly OFF and NFET 716 is very small, the gate leakage is minimized. Since PFET 714 works against small NFET 716 its size may also be reduced in LSDL circuit 700. Correspondingly, the remaining devices in LSDL 700 can also be reduced in size. PFET 708 and NFET 709 drive a smaller PFET 714 and NFET 716 and can be reduced in size. A smaller PFET 708 and NFET 709 lead to smaller NFETs 710 and 713.

Adding the inverting stages comprising PFETs 717 and 718 and NFET 719 and inverter 720 used to generate FFP 722 results in a relatively small increase in power compared to the savings resulting from making large NFET 721 pulse driven.

Figure 8:
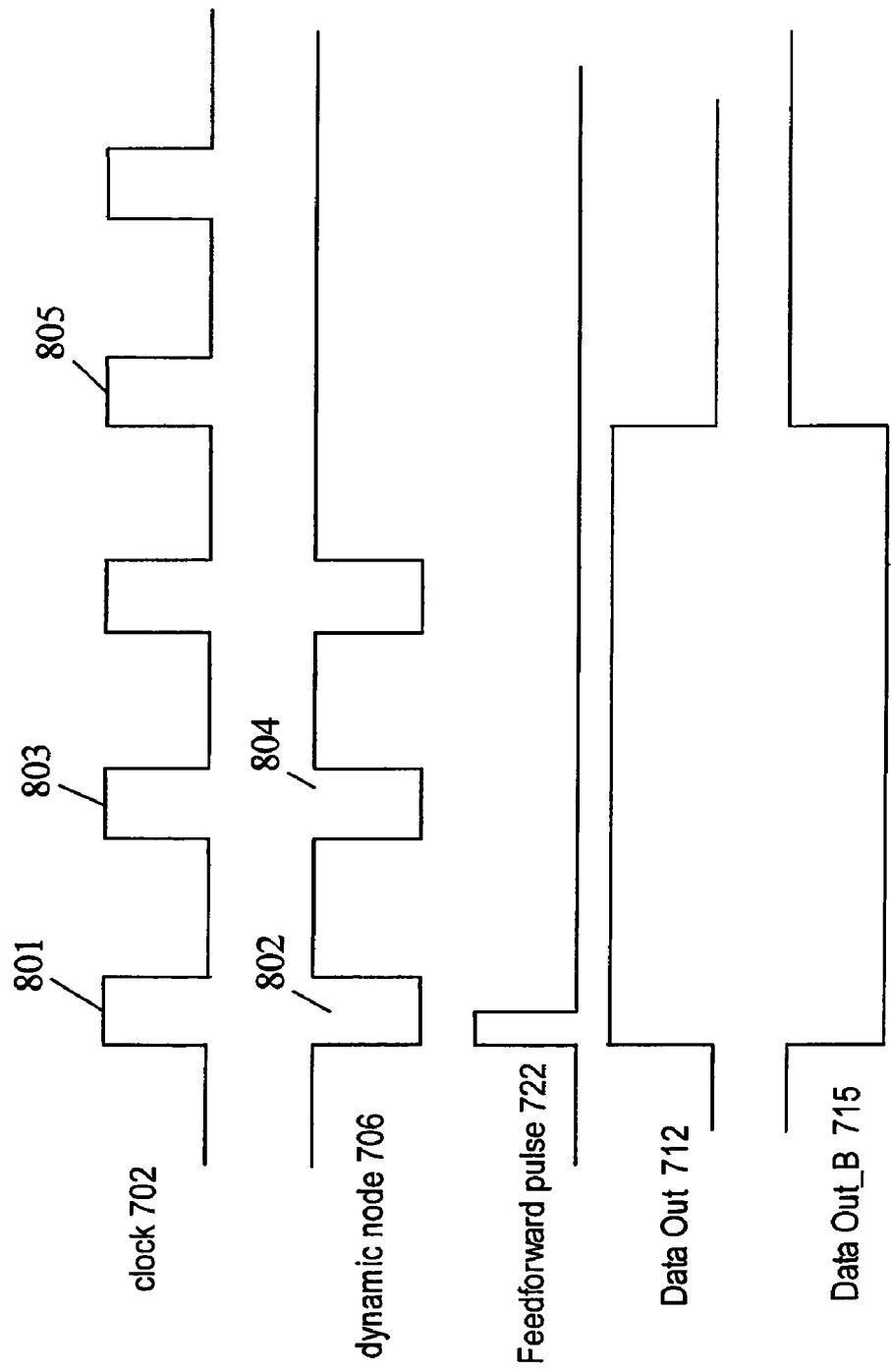
FIG. 8 is a timing diagram of the LSDL logic gate in FIG. 7.

FIG. 8 is a timing diagram of cycles of signals of the embodiment of FIG. 7. Initially, Data Out_B 715 is a logic one. If the states of Data Inputs 701 generate a logic true condition, then when clock 702 transitions to a logic one (pulse 801), dynamic node 706 evaluates to a logic zero (pulse 802). Since Data Out_B 715 was a logic one, inverter 720 turns PFET 717 ON and PFET 718 and NFET 719 generate a positive pulse on FFP 722 which turns ON NFET 721 quickly pulling Data Out_B 715 to a logic zero. When dynamic node 706 transitions to a logic zero, Data Out 712 transitions to a logic one which turns ON keep NFET 716 holding Data Out_B 715 a logic zero. Half latch PFET 711 turns ON holding Data Out 712 at a logic one. When clock 702 again transitions to a logic one (pulse 803), dynamic node 706 again evaluates to a logic zero (pulse 804). However, on this cycle Data Out_B 715 is a logic zero and inverter 720 keeps PFET 717 from turning ON and no FFP 722 pulse is generated. On the fourth cycle (pulse 805) of clock 702, dynamic node 706 evaluates to a logic one and Data Out 712 transitions to a logic zero turning NFET 716 OFF and turning ON PFET 714. Data Out_B 715 transitions to a logic one. Since Data Out_B 715 is a logic one, the next time dynamic node 706 evaluates to a logic zero another FFP 722 pulse will be generated.

Although the present invention and its advantages have been described in detail, it should be understood that various changes, substitutions and alterations can be made herein without departing from the spirit and scope of the invention as defined by the appended claims.

What is claimed is:

1. A logic circuit comprising:
    a dynamic logic portion for evaluating a Boolean function of a plurality of data input signals, wherein a logic signal on a dynamic node asserted in response to a first logic state of a clock signal comprises either a logic true or a logic false Boolean combination of the plurality of the data input signals and the dynamic node is pre-charged to a first logic state corresponding to the logic false Boolean combination when the clock signal has a second logic state;

a static portion having a pull-down input, a data input coupled to the dynamic node, a data output node generating a latched data output signal in response to the logic signal and the clock signal, and an inverted data output node generating a latched inverted data output signal as the logic inversion of the latched data output signal, wherein the inverted data output node is set to a logic zero when the pull-down input is a logic one and the inverted data output node is held at a logic zero when the data output signal is a logic one; and a feedforward pulse circuit having a first input coupled to the dynamic node, a second input coupled to the inverted data output node, and a pulse node coupled to the pull-down input and generating a feedforward pulse, wherein the feedforward pulse is a logic one when the dynamic node is a logic zero and the inverted data output signal is a logic one.

2. The logic circuit of claim 1, wherein the dynamic logic portion comprises:

a first P channel field effect transistor (PFET) having a gate terminal coupled to the clock signal, a source terminal coupled to a positive power supply voltage and a drain terminal coupled to the dynamic node, wherein the dynamic node is coupled to the positive power supply voltage in response to the first logic state of the clock signal and isolated from the positive power supply voltage in response to a second logic state of the clock signal;

a logic tree having a plurality of logic inputs, a positive tree terminal coupled to the dynamic node, and a negative tree terminal, wherein the positive tree terminal is coupled to the negative tree terminal in response to first logic states of the plurality of logic inputs and isolated from the negative tree terminal in response to second logic states of the plurality of logic inputs; and a first N channel FET (NFET) having a gate terminal coupled to the clock signal, a drain terminal coupled to the negative tree terminal and a source terminal coupled to a negative power supply voltage, wherein the negative tree terminal is coupled to the negative power supply voltage in response to the second logic state of the clock signal and isolated from the negative power supply voltage in response to a first logic state of the clock signal.

3. The logic of claim 1 wherein the static portion comprises:

a first PFET having a gate coupled to the dynamic node, a source coupled to the first power supply voltage and a drain;

a first NFET having a gate coupled to the gate of the first PFET, a drain coupled to the drain of the first PFET for a data output node generating the data output signal, and a source;

a second NFET having a gate coupled to the second clock signal, a source coupled to the second power supply voltage and a drain coupled to the source of the first NFET;

a third NFET having a drain coupled to the drain of the second NFET, a source coupled to the second power supply voltage and a gate;

an inverting circuit having an input coupled to the data output node and an output coupled to the inverted data output node;

a fourth NFET having a source coupled to the second power supply voltage, a drain coupled to the inverted data output node, and a gate coupled to the pull-down input; and and a second PFET having a gate coupled to the output node of the inverting circuit, a drain coupled to the data output node and a source coupled to the first power supply voltage.

4. The logic circuit of claim 1, wherein the feedforward pulse circuit comprises:

a first NFET having a source coupled to the second power supply voltage, a drain and a gate coupled to the dynamic node;

a first PFET having a drain coupled to the drain of the first NFET forming the pulse node, a gate coupled to the dynamic node and a source;

a second PFET having a drain coupled to the source of the first PFET, a source coupled to the first power supply voltage and a gate; and an inverter having an input coupled to the inverted data output node, and output coupled to the gate of the first PFET.

5. The logic circuit of claim 3, wherein the inverting circuit comprises:

a third PFET having a gate coupled to the data output node, a source coupled to the first power supply voltage and a drain; and a fifth NFET having a gate coupled to the gate of the third PFET, a source coupled to the second power supply voltage and a drain coupled to the drain of the third PFET forming the inverted data output node.

6. The logic circuit of claim 5, wherein the fourth NFET is substantially larger than the fifth NFET.

7. The logic circuit of claim 6, wherein the fourth NFET is about ten times larger than the fifth NFET.

8. The logic circuit of claim 6, wherein all PFETs and all NFETs in a logic path driving the fifth NFET may be made smaller when the fourth NFET is made substantially larger than the fifth NFET.

9. A data processing system comprising:
a central processing unit (CPU); and
a memory operable for communicating instructions and operand data to the CPU which includes a logic system having a logic circuit with a dynamic logic portion for evaluating a Boolean function of a plurality of data input signals, wherein a logic signal on a dynamic node asserted in response to a first logic state of a clock signal comprises either a logic true or a logic false Boolean combination of the plurality of the data input signals and the dynamic node is pre-charged to a first logic state corresponding to the logic false Boolean combination when the clock signal has a second logic state, a static portion having a pull-down input, a data input coupled to the dynamic node, a data output node generating a latched data output signal in response to the logic signal and the clock signal, and an inverted data output node generating a latched inverted data output signal as the logic inversion of the latched data output signal, wherein the inverted data output node is set to a logic zero when the pull-down input is a logic one and the inverted data output node is held low when the data output signal is a logic one; and a feedforward pulse circuit having a first input coupled to the dynamic node, a second input coupled to the inverted data output node, and a pulse node coupled to the pull-down input and generating a feedforward pulse, wherein the feedforward pulse is a logic one when the dynamic node is a logic zero and the inverted data output signal is a logic one.

10. The data processing system of claim 9, wherein the dynamic logic portion comprises:
a first P channel field effect transistor (PFET) having a gate terminal coupled to the clock signal, a source terminal coupled to a positive power supply voltage and a drain terminal coupled to the dynamic node, wherein the dynamic node is coupled to the positive power supply voltage in response to the first logic state of the clock signal and isolated from the positive power supply voltage in response to a second logic state of the clock signal;
a logic tree having a plurality of logic inputs, a positive tree terminal coupled to the dynamic node, and a negative tree terminal, wherein the positive tree terminal is coupled to the negative tree terminal in response to first logic states of the plurality of logic inputs and isolated from the negative tree terminal in response to second logic states of the plurality of logic inputs; and
a first N channel FET (NFET) having a gate terminal coupled to the clock signal, a drain terminal coupled to the negative tree terminal and a source terminal coupled to a negative power supply voltage, wherein the negative tree terminal is coupled to the negative power supply voltage in response to the second logic state of the clock signal and isolated from the negative power supply voltage in response to a first logic state of the clock signal.

11. The data processing system of claim 9 wherein the static portion comprises:
a first PFET having a gate coupled to the dynamic node, a source coupled to the first power supply voltage and a drain;
a first NFET having a gate coupled to the gate of the first PFET, a drain coupled to the drain of the first PFET for a data output node generating the data output signal, and a source;
a second NFET having a gate coupled to the second clock signal, a source coupled to the second power supply voltage and a drain coupled to the source of the first NFET;
a third NFET having a drain coupled to the drain of the second NFET, a source coupled to the second power supply voltage and a gate;
an inverting circuit having an input coupled to the data output node and an output coupled to the inverted data output node;
a fourth NFET having a source coupled to the second power supply voltage, a drain coupled to the inverted data output node, and a gate coupled to the pull-down input; and
and a second PFET having a gate coupled to the output node of the inverting circuit, a drain coupled to the data output node and a source coupled to the first power supply voltage.

12. The data processing system of claim 9, wherein the feedforward pulse circuit comprises:
a first NFET having a source coupled to the second power supply voltage, a drain and a gate coupled to the dynamic node;
a first PFET having a drain coupled to the drain of the first NFET forming the pulse node, a gate coupled to the dynamic node and a source;
a second PFET having a drain coupled to the source of the first PFET, a source coupled to the first power supply voltage and a gate; and
an inverter having an input coupled to the inverted data output node, and output coupled to the gate of the first PFET.

13. The data processing system of claim 11, wherein the inverting circuit comprises:
a third PFET having a gate coupled to the data output node, a source coupled to the first power supply voltage and a drain; and
a fifth NFET having a gate coupled to the gate of the third PFET, a source coupled to the second power supply voltage and a drain coupled to the drain of the third PFET forming the inverted data output node.

14. The data processing system of claim 13, wherein the fourth NFET is substantially larger than the fifth NFET.

15. The data processing system of claim 14, wherein the fourth NFET is about ten times larger than the fifth NFET.

16. The logic circuit of claim 14, wherein all PFETs and all NFETs in a logic path driving the fifth NFET may be made smaller when the fourth NFET is made substantially larger than the fifth NFET.

* * * * *